(12) United States Patent
Chien et al.

(10) Patent No.: US 8,407,631 B2
(45) Date of Patent: Mar. 26, 2013

(54) METHOD FOR ENHANCING WAFER EXPOSURE EFFECTIVENESS AND EFFICIENCY

(75) Inventors: Chen-Fu Chien, Hsinchu (TW); Chia-Yu Hsu, Hsinchu (TW)

(73) Assignee: National Tsing Hua University, Hsinchu City (TW)

( * ) Notice: Subject to any disclaimer, the term of this patent is extended or adjusted under 35 U.S.C. 154(b) by 326 days.

(21) Appl. No.: 12/860,572

(22) Filed: Aug. 20, 2010

(65) Prior Publication Data

US 2012/0046775 A1    Feb. 23, 2012

(51) Int. Cl.
*G06F 17/50* (2006.01)
(52) U.S. Cl. ............... 716/54; 716/51; 716/56
(58) Field of Classification Search .............. None
See application file for complete search history.

(56) References Cited

PUBLICATIONS

Chien et al., "Overall Wafer Effectiveness (OWE): A Novel Industry Standard for Wafer Productivity," 2006 IEEE Int'l Symposium on Semiconductor Manufacturing, pp. 317-320.*
Chien et al., "Optimize Die Size Design to Enhance OWE for Design for Manufacturing," 2007 IEEE, 4 pages.*
SEMI Draft Document 3453—Provisional Guideline for Definition and Calculation of Overall Factory Efficiency (OFE) and Other Associated Factory-Level Productivity Metrics, SEMI 2002, pp. 1-11.*
SEMI E79-0200 Standard for Definition and Measurement of Equipment Productivity, SEMI 1999, 2000, pp. 1-24.*
Chien et al., "Analyzing Repair Decisions in the Site Imbalance Problem of Semiconductor Test Machines," IEEE Trans. on Semiconductor Manufacturing, vol. 16, No. 4, Nov. 2003, pp. 704-711.*
Chien et al., "An Iterative Cutting Procedure for Determining the Optimal Wafer Exposure Pattern," Correspondence, IEEE Trans. on Semiconductor Manufacturing, vol. 12, No. 3, Aug. 1999, pp. 375-377.*
Chien et al., "A Cutting Algorithm for Optimizing the Wafer Exposure Pattern," IEEE Trans. on Semiconductor Manufacturing, vol. 14, No. 2, May 2001, pp. 157-162.*
de Vries, "Investigation of Gross Die Per Wafer Formulas," IEEE Trans. on Semiconductor Manufacturing, vol. 18, No. 1, Feb. 2005, pp. 136-139.*
Oechsner et al., "From overall equipment efficiency (OEE) to overall Fab effectiveness (OFE)," Materials Science in Semiconductor Processing, vol. 5, 2003, pp. 333-339.*
Mingers, "An Empirical Comparison of Selection Measures for Decision-Tree Induction," Machine Learning, vol. 3, 1089, pp. 319-342.*

\* cited by examiner

*Primary Examiner* — Leigh Garbowski
(74) *Attorney, Agent, or Firm* — Muncy, Geissler, Olds & Lowe, PLLC

(57) ABSTRACT

The present invention applies the data mining methodology by which the wafer exposure effectiveness and efficiency are predictable in terms of the chip size, chip length and chip width. More specifically, in the present invention, an index, named "Mask-field-utilization weighted Overall Wafer Effectiveness" (MOWE), integrates the two parameters of "Overall Wafer Effectiveness" (OWE) and "Mask-Field-Utilization" (MFU), mainly regarding the wafer exposure effectiveness and efficiency respectively, in order to construct a model tree of the MOWE to achieve the data mining. By the MOWE model tree, the causal relationship between design independent variables and fabrication dependent variables is constructed, which can be accordingly applied as design guidelines in the design phase to improve the chip layout in order to produce a better wafer exposure effectiveness and efficiency.

7 Claims, 8 Drawing Sheets

METHOD FOR ENHANCING WAFER EXPOSURE EFFECTIVENESS AND EFFICIENCY

FIELD OF THE INVENTION

The present invention relates generally to a method for enhancing wafer exposure effectiveness and efficiency. In particular, the present invention relates to a method which applies the data mining methodology to predict the wafer exposure effectiveness and efficiency in terms of the chip size, chip length and chip width.

BACKGROUND OF THE INVENTION

As the global competition of semiconductor industry continues to become keen, semiconductor companies strive to maintain competitive advantages through the yield enhancement, the productivity improvement, and the cost reduction. Along with the shrinking of the feature size and the increasing complexity of the integrated circuit (IC) technology, the impact of unpredictable variations of manufacturing process are increasing and results in the low yield. The low yield problems can hardly be solved by the improvement and compensation of the manufacturing process. The modifications of the chip design also need to consider.

The chip size (i.e. die size), determined by the IC layout design, will be typically designed large enough to accommodate the micro-circuitry of ICs to ensure the desired functionality without considering wafer exposure effectiveness and efficiency. The wafer exposure effectiveness, the accounting of the gross dies per wafer is determined by the chip size and the exposure layout. In addition to the wafer exposure efficiency, the shot number of exposure equipment (i.e. stepper or scanner) for wafer exposure per layer is determined by the utilization of mask field which is also influenced by chip size.

In the conventional technologies, most studies focused on the yield improvement, but little studies made efforts on the improvements on the number of gross dies, the throughput, and the amount of exposure wafer per unit time in the lithography process. There are some existing studies that model the number of gross dies in terms of the chip size; however, they merely can be used as a try and error method to validate an improvement and will not do any favor for an IC designer to decide the designable variables.

SUMMARY OF THE INVENTION

One objective of the present invention is to provide a method for enhancing wafer exposure effectiveness and efficiency, which applies the data mining methodology to predict the wafer exposure effectiveness and efficiency in terms of the chip area, chip length and chip width. Accordingly, the causal relationship between design independent variables and fabrication dependent variables is constructed, which can be applied as a basis of design guidelines in the design phase to improve the chip layout in order to produce a better wafer exposure effectiveness and efficiency. This implements the concept of Design for Manufacturability (DFM).

The present invention provides the method for enhancing wafer exposure effectiveness and efficiency, which comprising the steps of: identifying independent variables and dependent variables; collecting data associated with a plurality of wafers and a mask used to pattern a plurality of dies on each wafer, wherein the exposure field and the mask field are defined on the mask; preprocessing the collected data; computing parameters of OWE (Overall Wafer Effectiveness) and MFU (Mask-Field-Utilization) respectively for each wafer, wherein the OWE is defined by the fraction of the area of good dies produced on each wafer to the total area of each wafer, and the MFU is the fraction of the area of the exposure field to the area of the mask field; calculating an index of MOWE (Mask-field-utilization weighted Overall Wafer Effectiveness) for each OWE and MFU to be one of the dependent variables, wherein the MOWE is the product of the OWE and the MFU; and constructing a model tree for the MOWE in terms of independent variables.

Based on the MOWE behavior model tree as constructed, the causal relationship between chip size variables and MOWE is constructed, which can be accordingly applied as design guidelines in the design phase to improve the chip layout in order to produce a better wafer exposure effectiveness and efficiency.

BRIEF DESCRIPTION OF THE DRAWINGS

To make an easy understanding of the objectives, characteristics and advantages of the present invention, the embodiments are described in detail in cooperation with the following drawings. It should be emphasized that the features on the drawings are not drawn to scale.

DETAILED DESCRIPTION OF THE PREFERRED EMBODIMENTS

The contents of the present invention will be described in detail with reference to the figures. Specific embodiments are given for illustrative purposes. However, the persons skilled in the art should understand that the embodiments are not used to restrict the scopes of the present invention. Any equivalent modifications or variations according to the spirit of the present invention should also be included within the scope of the present invention.

Figure 1:
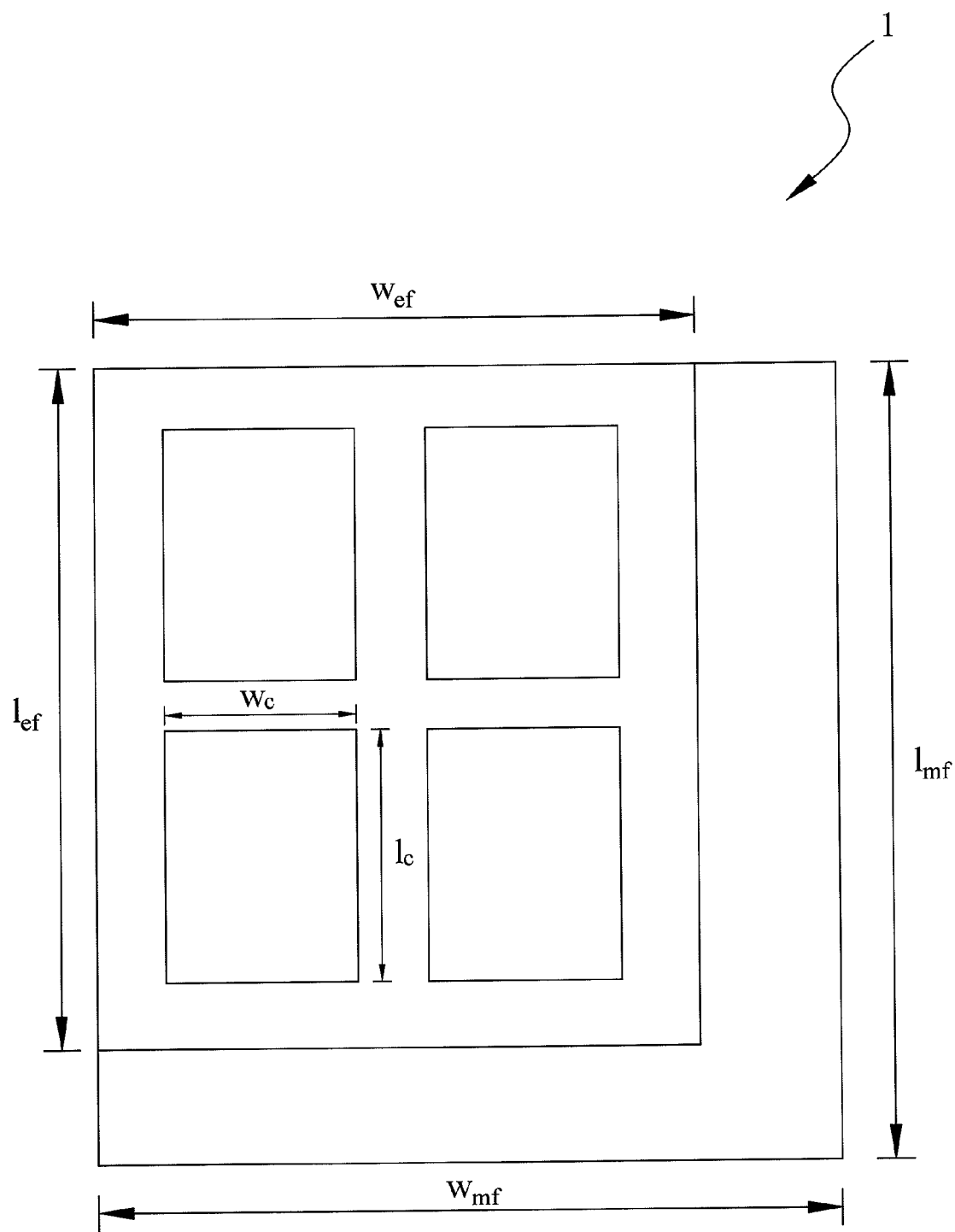
FIG. 1 illustrates a mask (or a reticle) on which the lengths and widths of one mask field, one exposure field and one chip are defined respectively.
Figure 2:
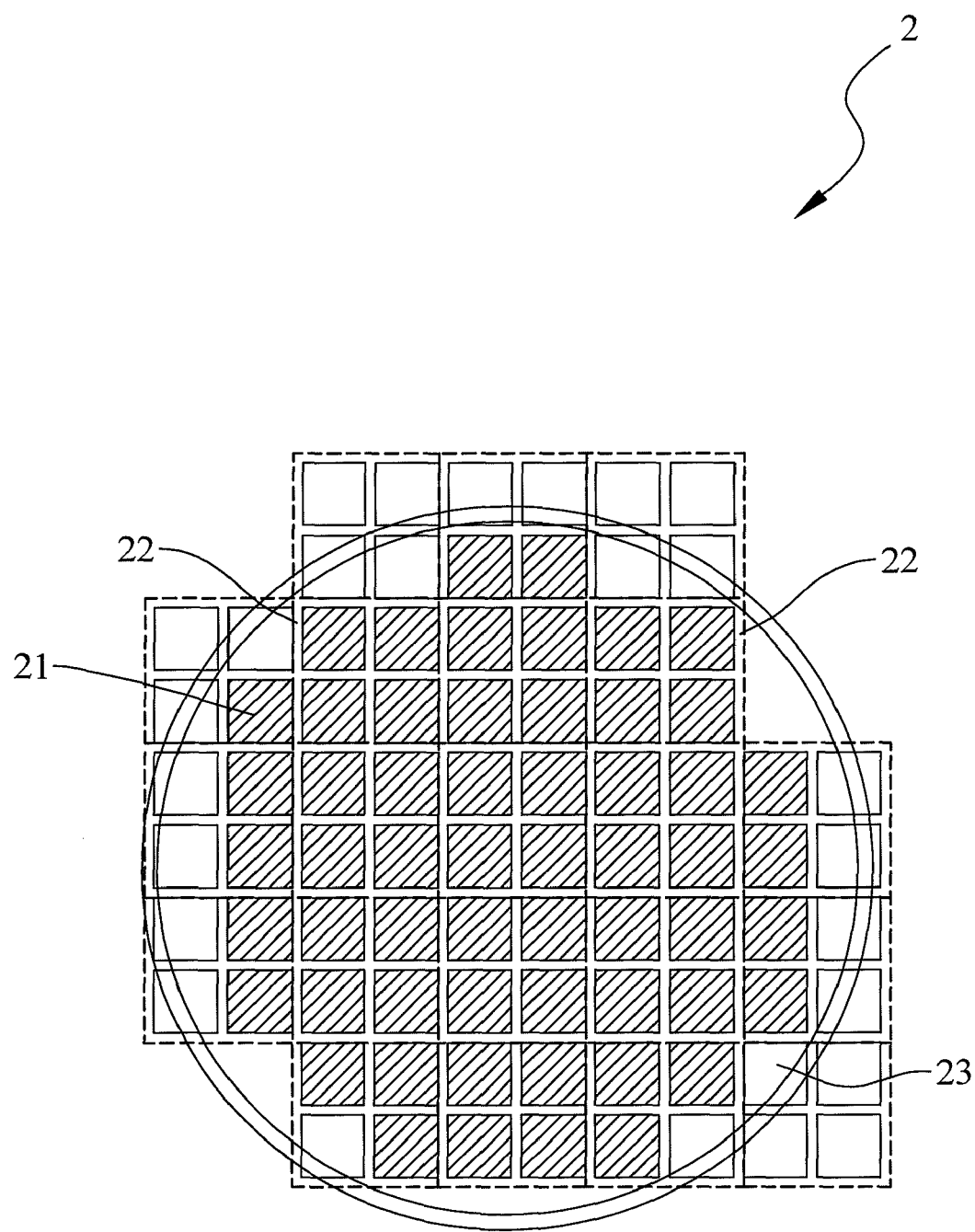
FIG. 2 shows a plurality of chips and scribe lines on a wafer.

Please refer to FIGS. 1 and 2 which illustrate a mask (or a reticle) and a plurality of dies on a wafer. In FIG. 1, it is an example of the mask 1 that can be used to expose four dies on the wafer 2 (in FIG. 2) at one time, the number of which is given for an illustrative purpose, not a restriction to the present invention.

In the wafer fabrication, a wafer is exposed to a multiple-step photolithography (exposure) process, each of the steps with one mask. One of the mask defines one layer on which the electronic device is fabricated. A stepper (or a scanner) is the equipment used to perform the photolithography process. The stepper steps from one location to another on the wafer 2 until the entire wafer 2 is exposed by projecting light through the mask 1. Each movement (step) of the stepper is called "one exposure shot".

In FIG. 2, on the wafer 2, each die 21 on the wafer 2 is defined and separated by scribe lines 22. By breaking or cutting on the scribe lines 22, the dies (chips) can be separated from the wafer 2. In FIG. 2, it also shows multiple incomplete exposure dies 23 along the wafer border and they are not exposed completely and cannot function well.

The gross die number and exposure shot number are mainly influenced by the chip area, the product of the chip length and the chip width. The chip length and the chip width are denoted as $l_c$ and $w_c$, and they are defined respectively in FIG. 1. For a given chip size, by changing the chip length $l_c$ and the chip width $w_c$, various combinations of the gross die number (#GD) and exposure shot number (#shot) can be achieved.

In the present invention, an index, MOWE (Mask-field-utilization weighted Overall Wafer Effectiveness), is adopted to integrate the influence of the chip area $a_c$, chip length $l_c$ and chip width $w_c$ and accordingly evaluate the wafer exposure efficiency and effectiveness. The MOWE can be represented as:

$$MOWE = OWE \times MFU \quad (1)$$

In formula (1), the parameter of "OWE" is the abbreviation of "Overall Wafer Effectiveness", and can be represented as:

$$OWE = \frac{\text{good die area}}{\text{total wafer area}} \times 100\% \quad (2)$$

In consideration of the wafer area loss in different aspects, the OWE can be composed of multiple components as:

$$OWE = \frac{\text{available area}}{\text{total wafer area}} \times \frac{\text{exposable area}}{\text{available area}} \times \frac{\text{gross die area}}{\text{exposable area}} \times \frac{\text{good die area}}{\text{gross die area}} \times 100\% \quad (3)$$

$$= E_A \times E_L \times E_R \times E_Y \quad (4)$$

Where available efficiency $E_A = \frac{\text{available area}}{\text{total wafer area}} \times 100\%$ (5)

litho efficiency $E_L = \frac{\text{exposable area}}{\text{available area}} \times 100\%$ (6)

rate efficiency $E_R = \frac{\text{gross die area}}{\text{exposable area}} \times 100\%$ (7)

yield efficiency $E_Y = \frac{\text{good die area}}{\text{gross die area}} \times 100\%$ (8)

The wafer area loss may be resulted from the equipment limitations, the lithography requirements, the incomplete exposure dies (shown in FIG. 2), the defective dies, etc. In meaning, the OWE is the fraction of good die area to the total wafer area, which can be decomposed to drive various improvements in order to maximize the wafer exposure effectiveness.

In formula (1), the parameter of "MFU" is the abbreviation of "Mask-Field-Utilization" that is the utilization rate of the exposure filed area to the total mask-field area. It can be represented as:

$$MFU = \frac{l_{ef} \times w_{ef}}{l_{mf} \times w_{mf}} \times 100\% \quad (9)$$

where $l_{mf}$ is the length of the mask filed, $w_{mf}$ is the width of the mask filed, $l_{ef}$ is the length of the exposure field and $w_{ef}$ is the width of the exposure field. Please refer to FIG. 1 to see the definitions of these geometric parameters.

Figure 3:
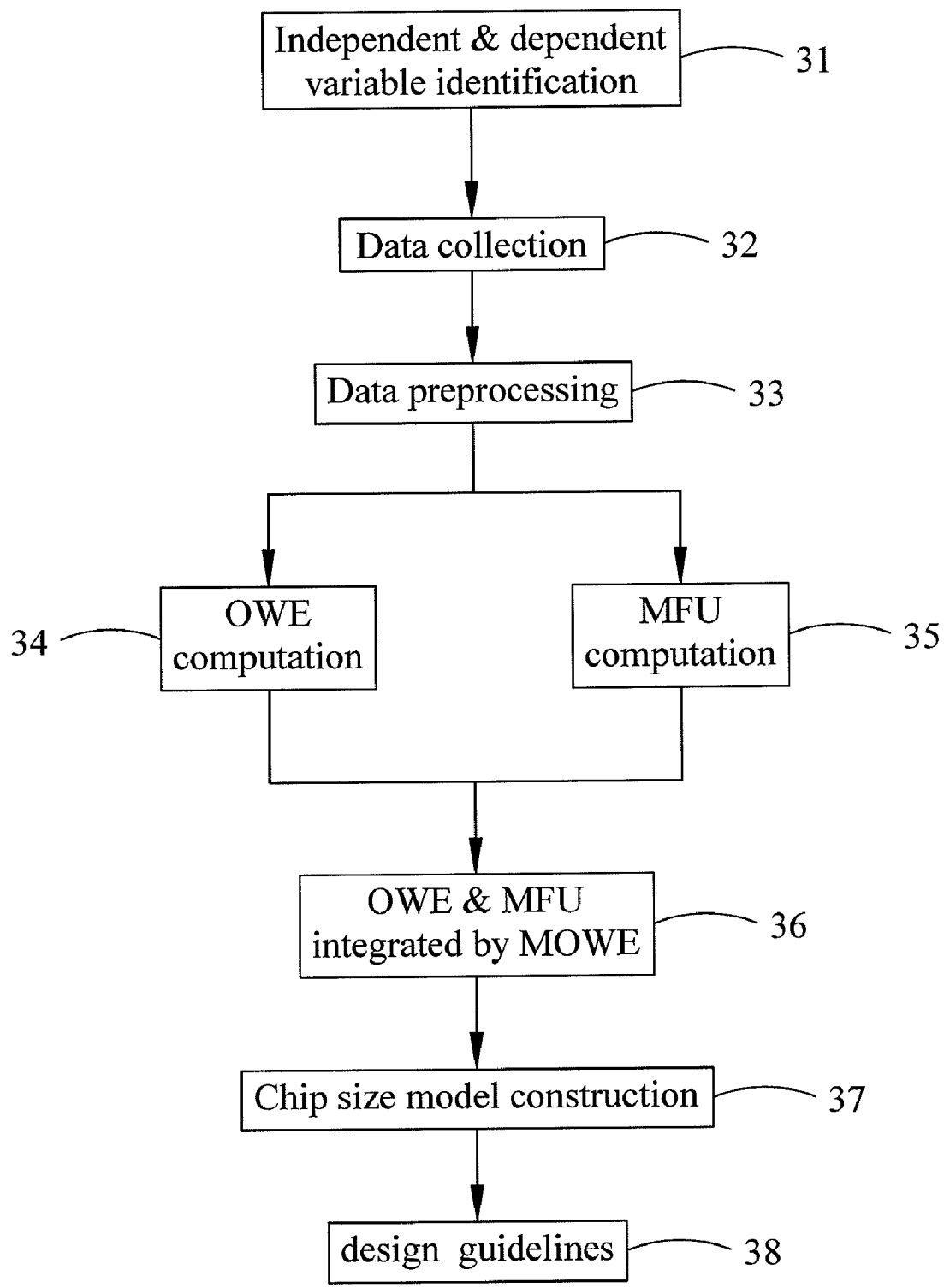
FIG. 3 is the flowchart according to one embodiment of the present invention.

Referring to FIG. 3, it is the flowchart according to one embodiment of the present invention. The present invention relates to a method for enhancing wafer exposure effectiveness and efficiency. In order to achieve this goal, the causal relationship between the independent (designable) variables and the dependent (response) variables needs to be explored. As a first step, accordingly, in Step 31, the independent and dependent variables are identified. In the present invention, the independent variables may be the chip area $a_c$, chip length $l_c$ and chip width $w_c$; while the dependent variables may be, for example, the MOWE.

In Steps 32 and 33, huge data are collected and preprocessed. Based on the preprocessed data, the OWE and the MFU are calculated respectively for each wafer in Steps 34 and 35. The two parameters of the OWE and MFU are integrated to produce the MOWE in Step 36. In Step 37, by mining the causal relationship between the designable and the response variables as identified in Step 31, the chip size models are accordingly constructed and can be used as the design guidelines (in Step 38).

The present invention is related to the method for enhancing wafer exposure efficiency and effectiveness by applying the data mining methodology to construct the behavior models for gross die number #GD and shot number #shot, and to generate the chip size rules. More specifically, the model tree method is adopted to construct the MOWE behavior models in terms of the chip area $a_c$, the chip length $l_c$ and the chip width $w_c$. A model tree, at each of its leaf nodes, builds a linear regression function instead of a constant to predict attribute values. The purpose of the regression functions is to dig out the relationship between independent and dependent variables. That is, by integrating one or more independent (designable) variable values, dependent (response) variable values can be predicted.

The model tree performs the recursive partitions to grow a tree structure on a basis of the error measurement of the standard deviation of the target variable at each node. At one particular note, the splitting criterion of the model tree applies the maximum expected error reduction to determine the attribute to split the training data. In particular, the model tree performs a binary splitting and has a smaller tree structure and better prediction accuracy compared to a regression tree.

In building a model tree, two main stages are concerned. In the first step, a decision tree induction is recursively partitioned by minimizing the intra-subset variation of the target variables. Secondly, the tree pruning and smoothing is performed to minimize the estimated error by replacing the sub-trees with the linear regression functions.

In building the model tree for the MOWE behavior model, initially, a training dataset is entered into the root node of the tree and tests are applied to search all possible splits for all predictor attributes. The best discriminates among the MOWE are chosen and the next descendent nodes are determined recursively. In one embodiment of the present invention, for each node, the standard deviation of a sample set is used as the measurement of error at that node. In particular, the attribute with the maximum expected error reduction is selected by the Standard Deviation Reduction (SDR) that is defined as:

$$SDR = SD(T) - \sum_i \frac{|T_i|}{|T|} \times SD(T_i) \quad (10)$$

where T is the training dataset at one particular node; $T_1, T_2, \ldots, T_k$ is the sets that results from splitting T at that particular node by a selected attribute; and $SD(T_i)$ is the standard deviation of the $i^{th}$ set $T_i$. The growth of the model tree is based on the selection of one attribute to reach the maximum SDR value. And the maximum SDR value implies the maximum expected error reduction. In splitting, the recursive partition terminates until the fraction of the standard deviation of T reaches to the user-defined threshold or the minimum sample size of the leaf is reached at the node.

In one embodiment of the present invention, the linear multivariate regression function is built at each terminal node, which is represented as:

$$LM = \beta_0 + \beta_1 x_1 + \beta_2 x_2 + \ldots + \beta_k x_k \quad (11)$$

where $\beta_0, \beta_1, \ldots, \beta_k$ are the regression coefficients calculated by the least square method, $x_0, x_1, \ldots, x_k$ are the chip size attribute values, and the suffix k represents the number of the total variables.

In the pruning process, the training dataset is fed into each node to calculate the absolute error of the expected value and the actual value. And then the mean absolute error (MAE) is applied to decide the pruning. If the MAE of one particular node is smaller than the expected value of the MAE of its two descendent nodes, the two descendent nodes will be pruned accordingly. Further, in consideration for the unseen data, the expected value of MAE for each unseen data will be multiplied by $(n+v)/(n-v)$ to compensate the underestimated expected error, where n is the number of the training data for one node and v is the number of the parameters in the linear regression function.

Further, rather than using the raw values directly, the smooth process is applied to the predicted value of the unseen data to compensate the sharp discontinuities that inevitably occur between the adjacent linear regression functions at the leaves of the pruned tree.

As described above, the model tree is constructed by the method of M5. However, M5 is given for an illustrative purpose, not as a restriction to the present invention. Other methods for constructing the model trees, for example RETIS, GUIDE or SECRET, may also be adopted. Since the construction of the model trees is well-known in the art, the descriptions are only given in a general level of detail.

Figure 4:
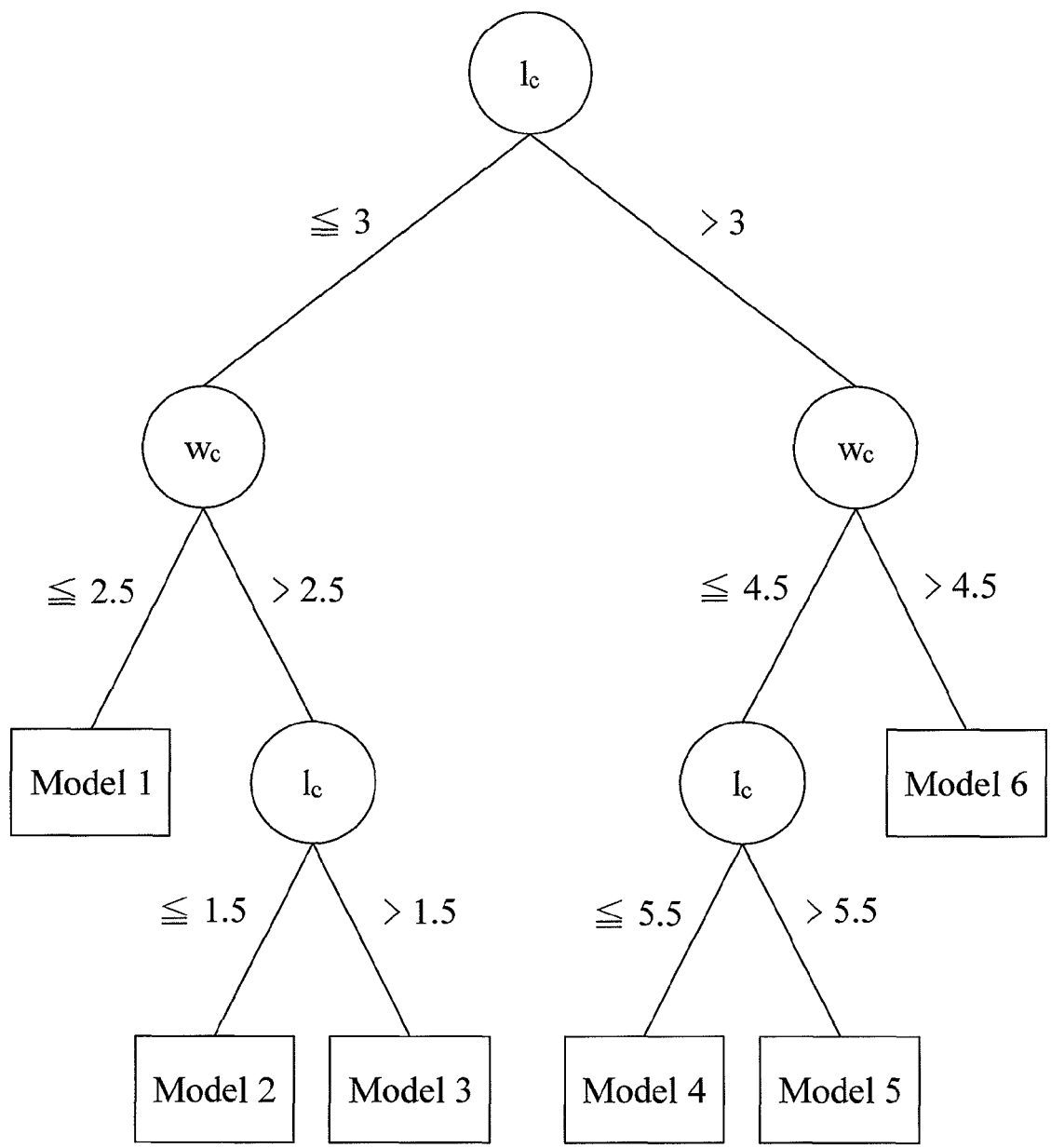
FIG. 4 is a model tree built for the MOWE behavior models in terms of the chip length $l_c$ and the chip width $w_c$ according to one embodiment of the present invention.
Figure 5:
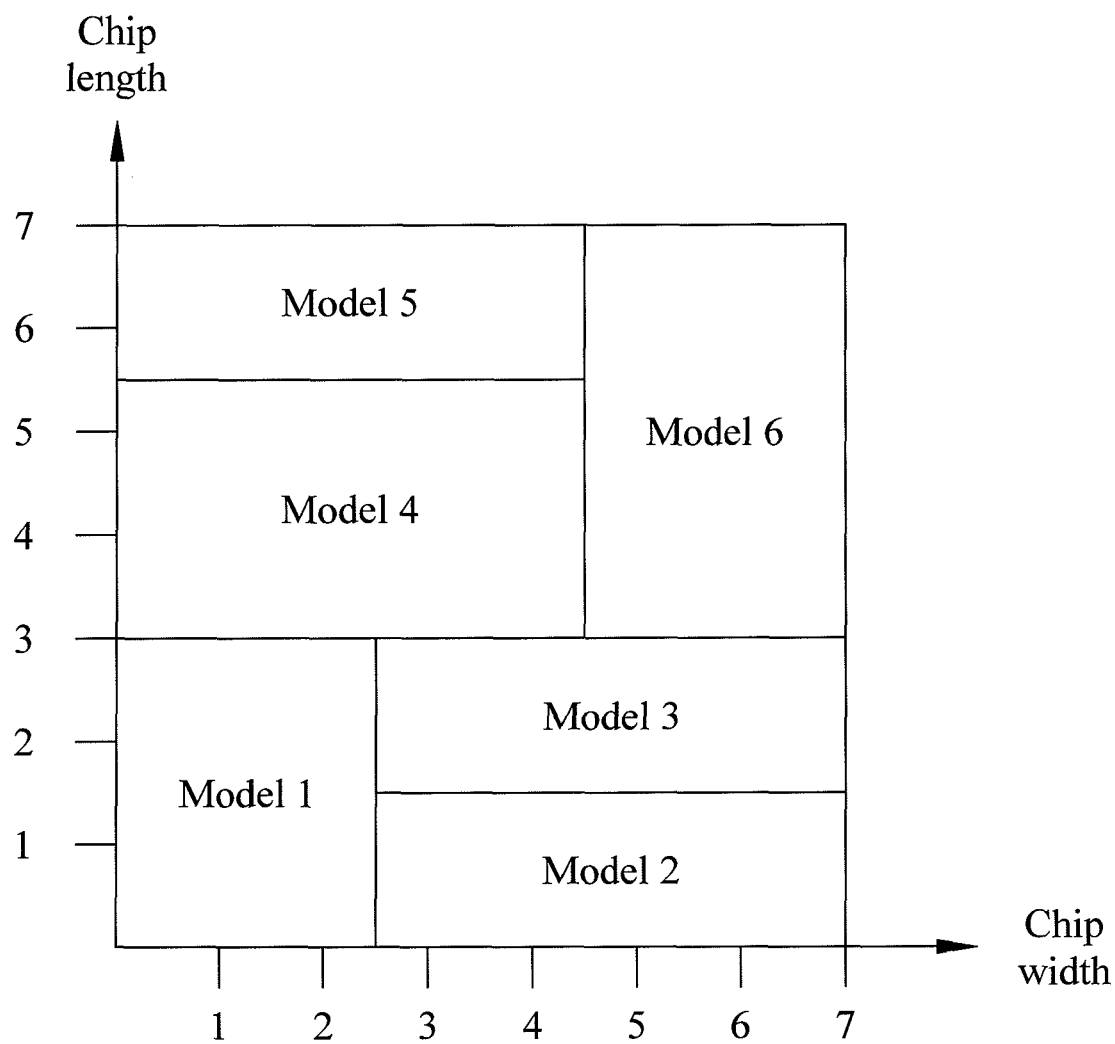
FIG. 5 is a two-dimensional plot in the chip size state-space mapped to FIG. 4.

Please refer to FIG. 4, which is a model tree built for the MOWE behavior models in terms of the chip length $l_c$ and the chip width $w_c$ according to one embodiment of the present invention. This model tree structure can be mapped to a two-dimensional plot in the chip size state-space, shown in FIG. 5, in which the horizontal axis is the chip width and the vertical axis is the chip length. On each leaf node of the model tree, an independent linear regression function is implemented. For example, at the leftmost leaf node, "IF" the chip length $l_c$ is not greater than 3 mm and the chip width $w_c$ is not greater than 2.5 mm, represented as $l_c \leq 3$, $w_c \leq 2.5$, "THEN" the MOWE is inferred by Model 1. Each path from the root node to one leaf node forms a conjunction in the rule antecedent, namely the "IF" statement. And the leaf node determines the predicted value to form the rule consequence, namely the "THEN" result. The IF-THEN rules can provide the useful information to understand the causal relationship between and the designable variables ($l_c$ and $w_c$ in this case), and the response variables (MOWE in this case).

The wafer exposure effectiveness and efficiency concerns the #GD and #shot. Further, the #GD is affected by the exposure layout, which is a function of the wafer size, the scribe line width, the exposure limitations, the chip size and the chip shape. The #shot is influenced by the exposure layout as well and the MFU, wherein the MFU is a function of the chip size and the chip shape. Accordingly, the behavior models of #GD and #shot both vary with the chip area $a_c$.

Regarding the data collection in Step 32 of FIG. 3, in one embodiment of the present invention, the data are collected on a basis of the same wafer size, width scribe lines and mask area, which are defined by the iterated procedures of die placement. Firstly, the wafer areas are determined by the wafer radius and divided into several areas based on the exposure limitations such as alignment mark, bottom line, and wafer edge. Secondly, the starting points are placed to the left bottom corners of the exposed cells in the corresponding areas. Thirdly, the corresponding exposure patterns are iteratively determined by moving vertical columns toward the borders to calculate the numbers of exposed cells and produced dies. Fourthly, among the solutions of different iterations, the best solution of exposure patterns with the maximum number of gross die and the minimum number of exposure steps are selected. According to the above procedures, the account of the number of gross die and the number of exposure fields could be calculated. Regarding Step 33 of FIG. 3, in order not to lose the generality, the data used are systematically transformed before the analysis. The training date for the MOWE model construction are collected by stratified sampling strategy; while the testing date are collected by the random sampling strategy. As a total, 53561 data are collected, and the chip length $l_c$, the chip width $w_c$, the chip area $a_c$, and the corresponding OWE for each wafer and MFU are calculated.

Figure 6:
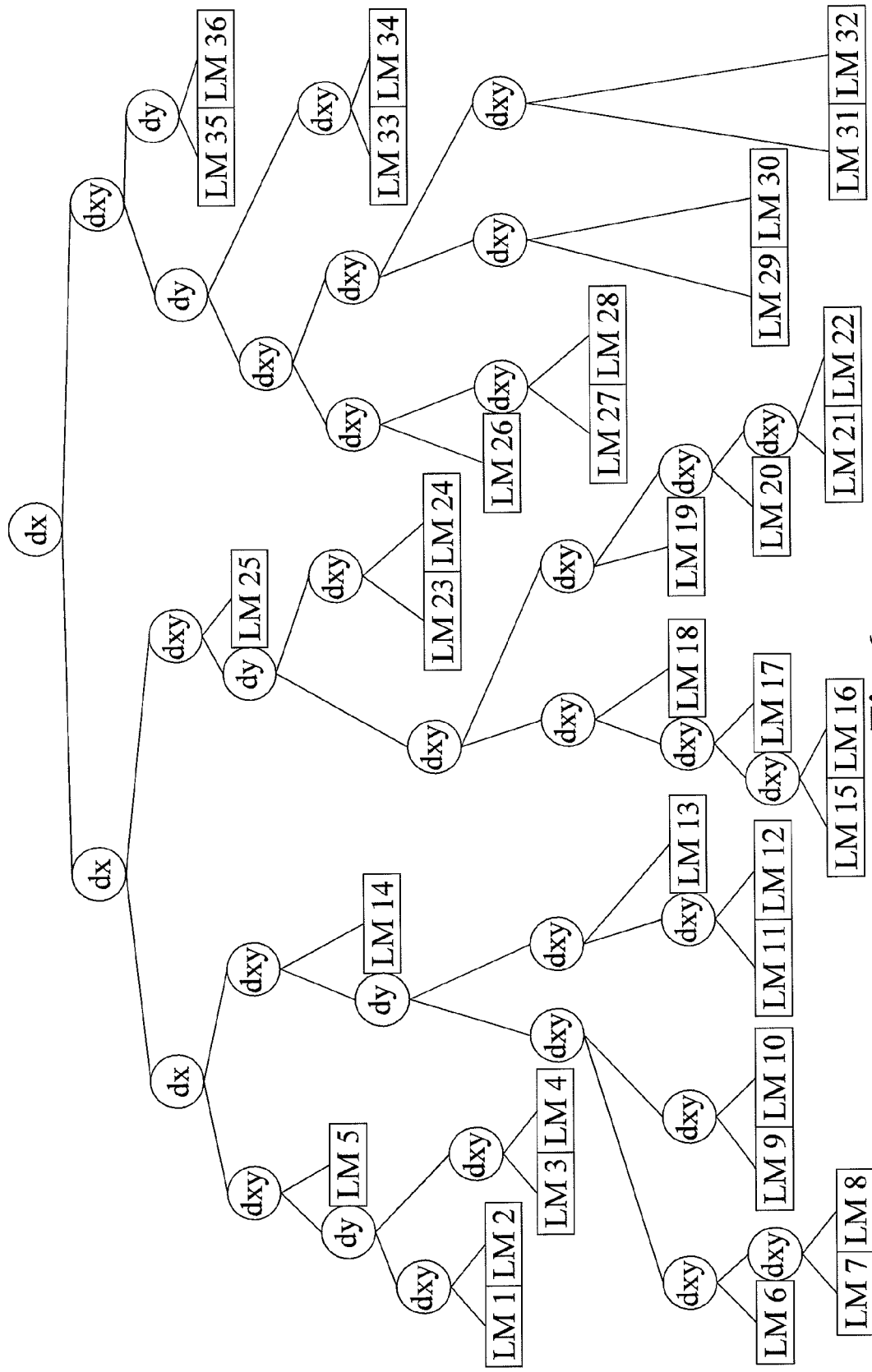
FIG. 6 shows the MOWE model tree constructed for one collected dataset.

FIG. 6 shows the MOWE model tree constructed for the collected data. In FIG. 6, the model tree is split into 36 leaf nodes. The minimum number at each leaf node of the derived decision tree is set by the user-defined threshold. As mentioned, each leaf node represents one linear regression function. The IF-THEN rules of FIG. 6 are summarized to Table 1 for easy understanding.

TABLE 1 the IF-THEN rules for the MOWE model tree shown in FIG. 6

| | IF | | | | | | |
|---|---|---|---|---|---|---|---|
| Rule | $<w_c$ | $w_c \leq$ | $<l_c$ | $l_c \leq$ | $<a_c$ | $a_c \leq$ | THEN |
| 1 | 4.24 | 4.66 | 5.42 | 6.52 | 22.98 | 26.43 | MOWE = 2.125 + 0.026$w_c$ − 0.029$l_c$ + 2.555$a_c$ |
| 2 | 4.24 | 4.66 | 5.42 | 6.52 | 26.43 | 33.63 | MOWE = 2.417 + 0.026$w_c$ − 0.029$l_c$ + 2.545$a_c$ |
| 3 | 4.24 | 4.66 | 6.52 | 8.17 | 22.98 | 31.26 | MOWE = 1.811 + 0.026$w_c$ − 0.040$l_c$ + 2.048$a_c$ |
| 4 | 4.24 | 4.66 | 6.52 | 8.17 | 31.26 | 33.63 | MOWE = 2.596 + 0.026$w_c$ − 0.040$l_c$ + 2.022$a_c$ |

TABLE 1-continued the IF-THEN rules for the MOWE model tree shown in FIG. 6

| Rule | <$w_c$ | $w_c\leq$ | <$l_c$ | $l_c\leq$ | <$a_c$ | $a_c\leq$ | THEN |
|---|---|---|---|---|---|---|---|
| 5 | 4.24 | 4.66 | 6.52 | 8.17 | 33.63 | 52.29 | MOWE = 2.806 + 0.026$w_c$ − 0.022$l_c$ + 2.003$a_c$ |
| 6 | 4.66 | 5.10 | 5.42 | 6.52 | 22.98 | 27.76 | MOWE = 1.788 + 0.025$w_c$ − 0.032$l_c$ + 2.570$a_c$ |
| 7 | 4.66 | 5.10 | 5.42 | 6.52 | 27.76 | 28.52 | MOWE = 2.547 + 0.025$w_c$ − 0.032$l_c$ + 2.543$a_c$ |
| 8 | 4.66 | 5.10 | 5.42 | 6.52 | 28.52 | 29.23 | MOWE = 4.812 + 0.025$w_c$ − 0.032$l_c$ + 2.464$a_c$ |
| 9 | 4.66 | 5.10 | 5.42 | 6.52 | 29.23 | 30.70 | MOWE = 2.025 + 0.025$w_c$ − 0.032$l_c$ + 2.560$a_c$ |
| 10 | 4.66 | 5.10 | 5.42 | 6.52 | 30.70 | 36.86 | MOWE = 2.743 + 0.025$w_c$ − 0.032$l_c$ + 2.538$a_c$ |
| 11 | 4.66 | 5.10 | 6.52 | 8.17 | 22.98 | 32.94 | MOWE = 1.989 + 0.025$w_c$ − 0.047$l_c$ + 2.045$a_c$ |
| 12 | 4.66 | 5.10 | 6.52 | 8.17 | 32.94 | 34.40 | MOWE = 3.403 + 0.025$w_c$ − 0.047$l_c$ + 2.002$a_c$ |
| 13 | 4.66 | 5.10 | 6.52 | 8.17 | 34.40 | 36.86 | MOWE = 2.268 + 0.025$w_c$ − 0.047$l_c$ + 2.035$a_c$ |
| 14 | 4.66 | 5.10 | 6.52 | 8.17 | 36.86 | 52.29 | MOWE = 3.024 + 0.025$w_c$ − 0.022$l_c$ + 2.001$a_c$ |
| 15 | 5.10 | 5.91 | 5.42 | 6.52 | 22.98 | 29.10 | MOWE = 1.623 + 0.001$w_c$ − 0.019$l_c$ + 2.054$a_c$ |
| 16 | 5.10 | 5.91 | 5.42 | 6.52 | 29.10 | 29.88 | MOWE = 3.994 + 0.001$w_c$ − 0.019$l_c$ + 1.973$a_c$ |
| 17 | 5.10 | 5.91 | 5.42 | 6.52 | 29.88 | 31.03 | MOWE = 2.437 + 0.001$w_c$ − 0.019$l_c$ + 2.026$a_c$ |
| 18 | 5.10 | 5.91 | 5.42 | 6.52 | 31.03 | 32.84 | MOWE = 1.605 + 0.001$w_c$ − 0.019$l_c$ + 2.053$a_c$ |
| 19 | 5.10 | 5.91 | 5.42 | 6.52 | 32.84 | 34.65 | MOWE = 2.717 + 0.001$w_c$ − 0.019$l_c$ + 2.019$a_c$ |
| 20 | 5.10 | 5.91 | 5.42 | 6.52 | 34.65 | 35.87 | MOWE = 2.190 + 0.001$w_c$ − 0.019$l_c$ + 2.035$a_c$ |
| 21 | 5.10 | 5.91 | 5.42 | 6.52 | 35.87 | 36.71 | MOWE = 5.652 + 0.001$w_c$ − 0.019$l_c$ + 1.940$a_c$ |
| 22 | 5.10 | 5.91 | 5.42 | 6.52 | 36.71 | 41.60 | MOWE = 2.455 + 0.001$w_c$ − 0.019$l_c$ + 2.029$a_c$ |
| 23 | 5.10 | 5.91 | 6.52 | 8.17 | 22.98 | 38.47 | MOWE = 1.779 + 0.001$w_c$ − 0.026$l_c$ + 1.632$a_c$ |
| 24 | 5.10 | 5.91 | 6.52 | 8.17 | 38.47 | 41.60 | MOWE = 2.363 + 0.001$w_c$ − 0.026$l_c$ + 1.617$a_c$ |
| 25 | 5.10 | 5.91 | 6.52 | 8.17 | 41.60 | 52.29 | MOWE = 2.646 + 0.001$w_c$ − 0.016$l_c$ + 1.603$a_c$ |
| 26 | 5.91 | 6.4 | 5.42 | 6.52 | 22.98 | 34.91 | MOWE = 3.376 + 0.006$w_c$ − 0.037$l_c$ + 2.003$a_c$ |
| 27 | 5.91 | 6.4 | 5.42 | 6.52 | 34.91 | 35.81 | MOWE = 2.716 + 0.006$w_c$ − 0.037$l_c$ + 2.022$a_c$ |
| 28 | 5.91 | 6.4 | 5.42 | 6.52 | 35.81 | 36.66 | MOWE = 5.482 + 0.006$w_c$ − 0.037$l_c$ + 1.947$a_c$ |
| 29 | 5.91 | 6.4 | 5.42 | 6.52 | 36.66 | 37.67 | MOWE = 5.901 + 0.006$w_c$ − 0.037$l_c$ + 1.938$a_c$ |
| 30 | 5.91 | 6.4 | 5.42 | 6.52 | 37.67 | 38.60 | MOWE = 6.729 + 0.006$w_c$ − 0.037$l_c$ + 1.919$a_c$ |
| 31 | 5.91 | 6.4 | 5.42 | 6.52 | 38.60 | 39.71 | MOWE = 5.409 + 0.006$w_c$ − 0.037$l_c$ + 1.955$a_c$ |
| 32 | 5.91 | 6.4 | 5.42 | 6.52 | 39.71 | 52.29 | MOWE = 4.593 + 0.006$w_c$ − 0.037$l_c$ + 1.977$a_c$ |
| 33 | 5.91 | 6.4 | 6.52 | 8.17 | 22.98 | 43.27 | MOWE = 2.220 + 0.006$w_c$ − 0.037$l_c$ + 1.625$a_c$ |
| 34 | 5.91 | 6.4 | 6.52 | 8.17 | 43.27 | 46.44 | MOWE = 3.371 + 0.006$w_c$ − 0.053$l_c$ + 1.599$a_c$ |
| 35 | 5.91 | 6.4 | 6.52 | 8.17 | 46.44 | 48.60 | MOWE = 3.842 + 0.006$w_c$ − 0.026$l_c$ + 1.576$a_c$ |
| 36 | 5.91 | 6.4 | 6.52 | 8.17 | 48.60 | 52.29 | MOWE = 1.965 + 0.006$w_c$ − 0.026$l_c$ + 1.615$a_c$ |

Each row of Table 1 maps to one leaf node shown in FIG. 6. For example, Rule 1 reads as "IF a chip width $w_c$ is greater than 4.24 mm but not greater than 4.66 mm, the chip length $l_c$ is greater than 5.42 mm but not greater than 6.52 mm, and the chip area $a_c$ is greater than 22.98 mm² but not greater than 26.43 mm², THEN the MOWE is inferred by model 1, that is, MOWE=2.125+0.026 $w_c$−0.029 $l_c$+2.555 $a_c$.

As shown in Table 2, the MOWE model tree constructed by M5 can predict the MOWE of chip size correctly. The root mean squared errors (RMSEs) are 0.0679% and 0.0796% for the training dataset and the testing dataset respectively. The relative errors are 0.0076% in the training dataset and 0.0177% in the testing dataset, the results of which imply that the prediction accuracy of MOWE can be performed well by the use of the layout designable variables, comprising chip length $l_c$, chip width $w_c$ and chip area $a_c$.

TABLE 2 the prediction results of the model tree in FIG. 6

| | Training dataset | Testing dataset |
|---|---|---|
| RMSE (%) | 0.0679 | 0.0796 |
| Relative error (%) | 0.0076 | 0.0177 |

Figure 7:
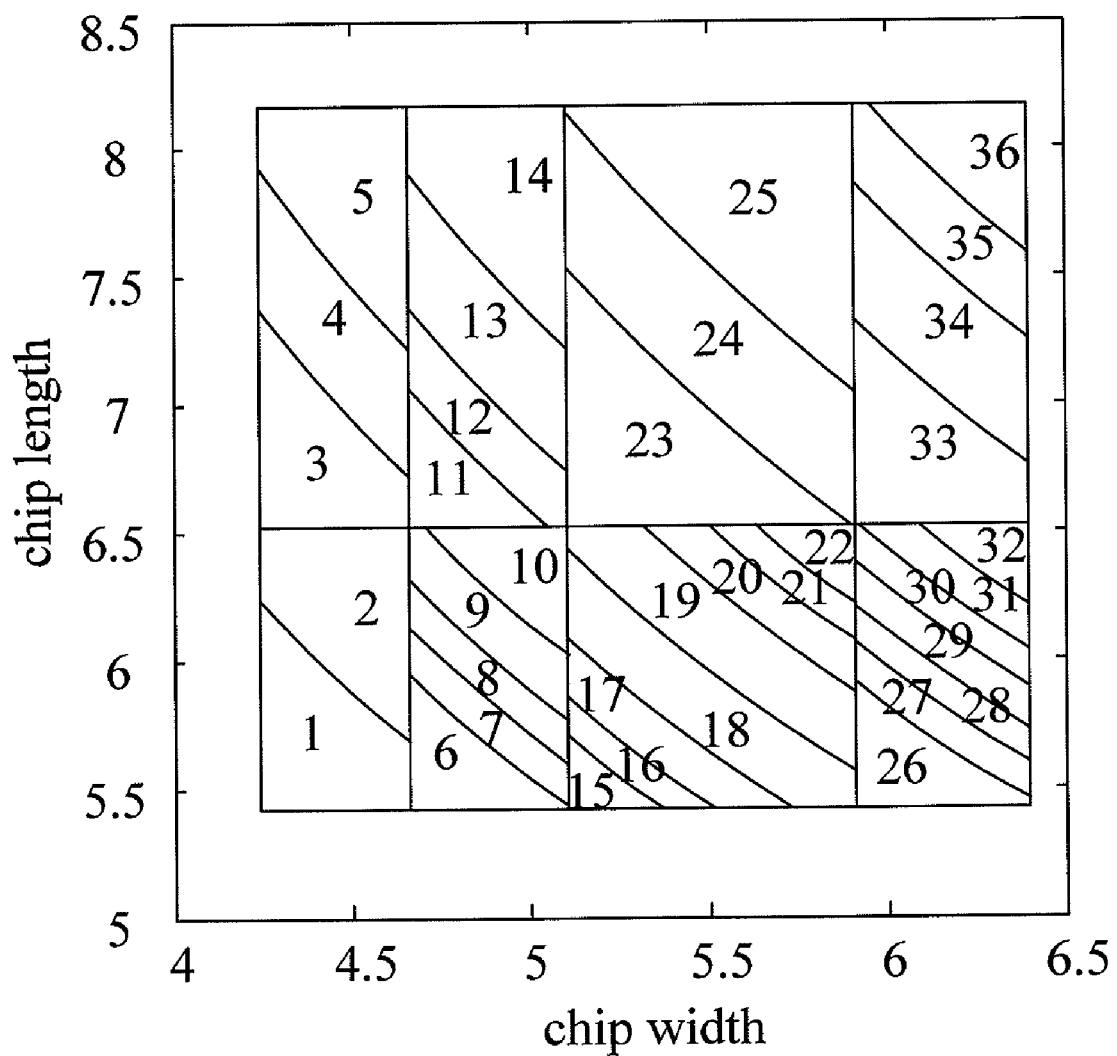
FIG. 7 is a two-dimensional plot in the chip size state-space mapped to FIG. 6.

The model tree structure shown in FIG. 6 can also be mapped to one two-dimensional plot in the chip size state-space, shown in FIG. 7, wherein the horizontal axis is the chip width and the vertical axis is the chip length. Each region, denoted by one digit, is contoured by the boundary lines defined by the calculation of the chip size. The changes of the MOWE according to the different chip sizes can be visualized. The two-dimensional visualization plot, shown in FIG. 7, may enable the IC designers have a quick and clear idea of the impact of the designable variables in order to predict the response variables.

In order to optimize the wafer exposure patterns under the existing device limitations, when a wafer size and non-exposable area are given, constructing the MOWE behavior models can drive the adjustment of the designable variables at the design phase to increase OWE and MFU simultaneously in fabrication. Based on the same layout pattern algorithms, the chip designs of the same chip area that have various chip lengths $l_c$ and chip widths $w_c$ will result in different OWE and MFU. On the other hand, while the chip size is not fixed, the chip size can be adjusted to produce higher OWE and MFU.

As an example shown in Table 3, in the original design of a specific IC product, the chip size is $(8.922 \times 8.981)$ mm$^2$ and the mask size used is $(26 \times 33)$ mm$^2$ for a 300 mm wafer, shown in the second row of Table 3. The OWE and MFU associated the layout pattern resulted from the original design are 83.15% and 57.29%, respectively. The design rules predicted by the MOWE behavior model are also shown in Table 3, which are categorized into two scenarios, the fixed chip area and the changed chip area. Associated with each of the scenarios, there are various design adjustments of the chip sizes, and their effectiveness and efficiency indices are shown also in Table 3.

TABLE 3

Chip size adjustment with different condition

| Scenario | # | Chip width | Chip length | chip area | OWE (%) | MFU (%) | MOWE (%) |
|---|---|---|---|---|---|---|---|
| Original | — | 8.922 | 8.9809 | 80.128 | 83.15 | 57.29 | 47.64 |
| Chip area is fixed | i | 12.620 | 6.3493 | 80.128 | 82.73 | 95.47 | 78.99 |
|  | ii | 7.890 | 10.1557 | 80.128 | 83.37 | 84.84 | 71.58 |
|  | iii | 9.330 | 8.590 | 80.145 | 83.39 | 57.29 | 47.78 |
| Chip area is changed | iv | 8.245 | 9.717 | 80.117 | 83.47 | 85.83 | 71.64 |
|  | v | 8.820 | 9.073 | 80.024 | 83.69 | 57.22 | 47.89 |
|  | vi | 8.227 | 9.740 | 80.131 | 83.59 | 85.84 | 71.75 |

Figure 8:
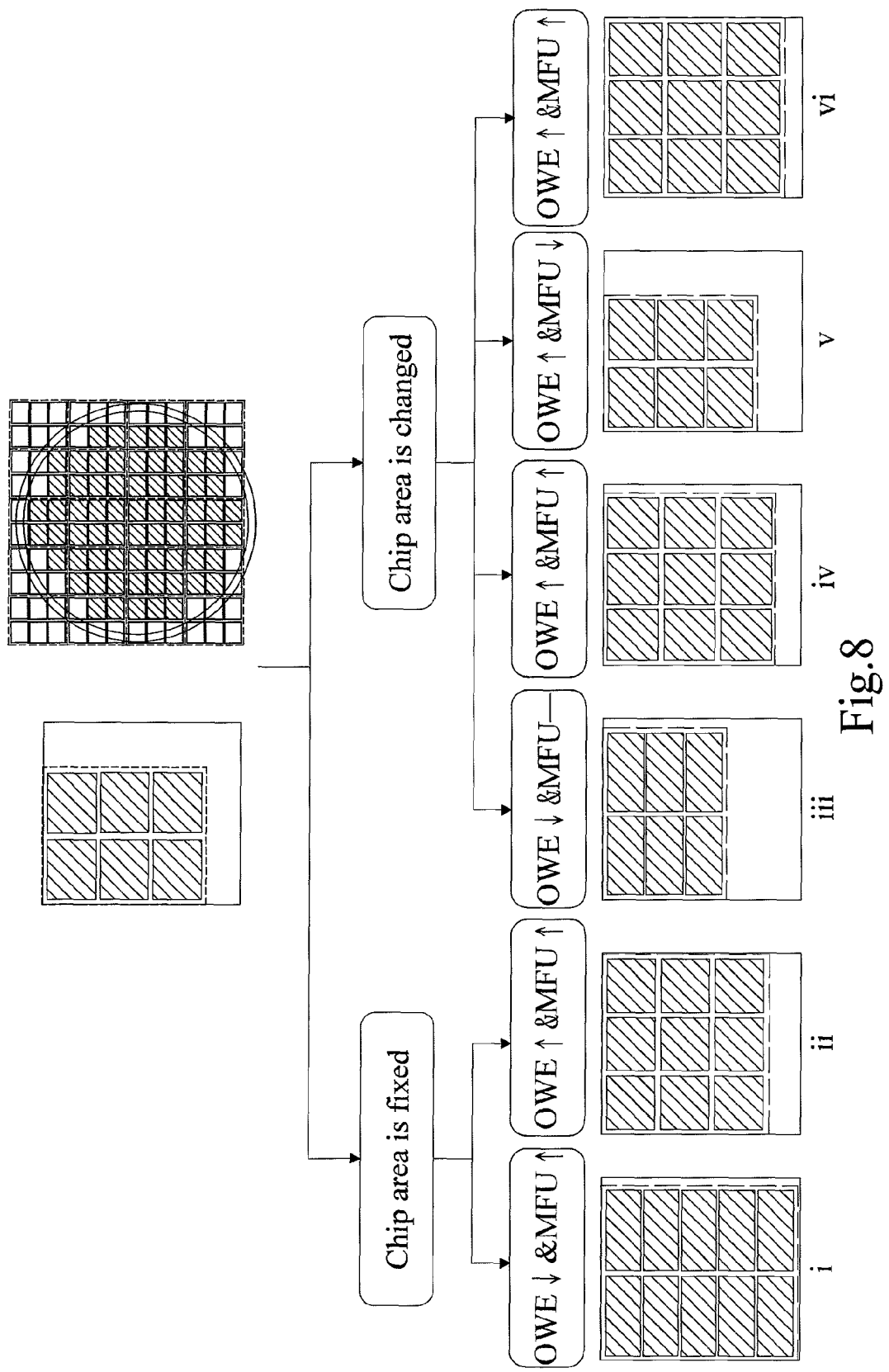
FIG. 8 shows the chip size adjustment according to the different requirements.

The effectiveness and efficiency indices of the two scenarios in Table 3 are categorized and illustrated in FIG. 8. FIG. 8 illustrates the chip size adjustment according to the different requirements. Accordingly, the IC designers can have a quick idea from FIG. 8 to make a good selection in order to meet both the requirements for the OWE and MFU.

Another example is shown in Table 4 below. It proves that the MOWE can be improved by the advised chip size induced by the MOWE model tree provided by the present invention. In particular, Table 4 shows that the MOWE associated with all products are improved and more dice and less number of shots are achieved.

TABLE 4

Empirical product validation results

| Product | Original chip size | Original MOWE | Advised chip width | Advised chip length | Improved MOWE | Increase of #GD | Decrease of # shot |
|---|---|---|---|---|---|---|---|
| A | 5 × 7 | 70.23% | 5.54~6.35 | 5.51~6.32 | 71.20% | 2 | 1 |
| B | 12 × 10 | 70.28% | 8.53~12.84 | 9.35~14.07 | 70.76% | 3 | 1 |
| C | 22.1 × 9.3 | 57.69% | 12.63~21.92 | 9.41~16.36 | 78.88% | 6 | 24 |
| D | 19 × 19 | 33.07% | 22.75~24.32 | 14.84~15.87 | 66.56% | 1 | 80 |

The embodiments described above are only to exemplify the present invention but not to limit the scope of the present invention. According to the specification, the drawings and tables of the present invention, a person skilled in the art should be able to make an equivalent variation without departing from the spirits and scopes of the present invention. Accordingly, any modification or variation according to the spirit of the present invention is to be also included within the scope of the present invention, which is based on the claims stated below.

What is claimed is:

1. A method for enhancing wafer exposure effectiveness and efficiency of a semiconductor lithographic manufacturing equipment, which comprises the steps of:
   (a) identifying independent variables and dependent variables;
   (b) collecting data associated with a plurality of wafers and masks, wherein each of the masks is used to pattern a plurality of chips on each wafer, the exposure field and the mask field are defined on the mask;
   (c) computing parameters of Overall Wafer Effectiveness (OWE) and Mask Field Utilization (MFU) respectively for each wafer, wherein the OWE is defined by the fraction of the area of good chips produced on each wafer to the total area of each wafer, and the MFU is the fraction of the area of the exposure field to the area of the mask field;
   (d) calculating an index of Mask Field Utilization Weighted Overall Wafer Effectiveness (MOWE) for each OWE and its corresponding MFU as one of the dependent variables, wherein the MOWE is the product of the OWE and the MFU; and
   (e) constructing a model tree with leaf nodes for the MOWE in terms of the independent variables where each leaf node forms a linear regression of a MOWE model.

2. The method of claim 1 which further comprises the step of preprocessing the collected data after Step (b) and before Step (c).

3. The method of claim 1 wherein the model tree in Step (e) is mapped to a two-dimensional plot of a chip length versus chip width.

4. The method of claim 1 wherein, in Step (e), the model tree for the MOWE is constructed by the method of M5.

5. The method of claim 1 wherein the independent variables are comprised of chip area, chip length and chip width.

6. The method of claim 1 wherein, in Step (e), the model tree comprises at least one root node and two leaf nodes, and each path from the root node to one of the leaf nodes forms an IF statement and each leaf node forms a linear regression function of the MOWE model as a THEN result.

7. The method of claim 6 wherein the MOWE model is expressed in terms of chip area, chip length and chip width.

* * * * *